(12) United States Patent
Izumi

(10) Patent No.: US 10,261,274 B2
(45) Date of Patent: Apr. 16, 2019

(54) OPTICAL FIBER CONNECTION UNIT HAVING CIRCULATION PATH FOR ALLOWING COOLANT TO CIRCULATE

(71) Applicant: FANUC CORPORATION, Yamanashi (JP)

(72) Inventor: Takashi Izumi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/353,849

(22) Filed: Nov. 17, 2016

(65) Prior Publication Data
US 2017/0139164 A1 May 18, 2017

(30) Foreign Application Priority Data
Nov. 18, 2015 (JP) ................. 2015-225885

(51) Int. Cl.
| | |
|---|---|
| *G02B 6/42* | (2006.01) |
| *H01S 5/022* | (2006.01) |
| *H01S 3/00* | (2006.01) |
| *H01S 5/024* | (2006.01) |
| *B23K 26/70* | (2014.01) |
| *H01S 5/02* | (2006.01) |
| *H01S 5/40* | (2006.01) |
| *H01S 5/04* | (2006.01) |
| *H01S 3/23* | (2006.01) |

(Continued)

(52) U.S. Cl.
CPC .......... *G02B 6/4268* (2013.01); *B23K 26/703* (2015.10); *G02B 6/4269* (2013.01); *G02B 6/4296* (2013.01); *H01S 3/0071* (2013.01); *H01S 5/02284* (2013.01); *H01S 5/02446* (2013.01); *H01S 3/005* (2013.01); *H01S 3/0404* (2013.01); *H01S 3/1643* (2013.01); *H01S 3/2316* (2013.01); *H01S 5/02* (2013.01); *H01S 5/4012* (2013.01)

(58) Field of Classification Search
CPC ... G02B 6/4268; G02B 6/4269; G02B 6/4296
See application file for complete search history.

(56) References Cited

U.S. PATENT DOCUMENTS

| | | | | |
|---|---|---|---|---|
| 4,730,885 A | * | 3/1988 | Doi ...................... | G02B 6/3814 385/75 |
| 5,481,556 A | * | 1/1996 | Daikuzono ............. | H01S 3/025 372/34 |

(Continued)

FOREIGN PATENT DOCUMENTS

| | | |
|---|---|---|
| CN | 1722549 A | 1/2006 |
| CN | 101082689 A | 12/2007 |

(Continued)

*Primary Examiner* — Ryan A Lepisto
*Assistant Examiner* — Erin D Chiem
(74) *Attorney, Agent, or Firm* — RatnerPrestia

(57) ABSTRACT

An optical fiber connection unit able to efficiently remove heat generated in the optical fiber connection unit. The optical fiber connection unit includes a closed circulation path, through which coolant for eliminating heat generated in the optical fiber connection unit by a laser beam propagating through the optical fiber connection unit circulates, and a coolant circulation device for causing the coolant to flow and circulate in the circulation path.

10 Claims, 12 Drawing Sheets

(51) Int. Cl.
*H01S 3/04* (2006.01)
*H01S 3/16* (2006.01)

(56) References Cited

U.S. PATENT DOCUMENTS

| | | | |
|---|---|---|---|
| 2002/0018497 A1* | 2/2002 | Naito | A61F 9/00821 |
| | | | 372/34 |
| 2006/0013274 A1* | 1/2006 | Nishikawa | H01S 3/04 |
| | | | 372/35 |
| 2007/0280620 A1 | 12/2007 | Matsuda et al. | |
| 2013/0235449 A1 | 9/2013 | Suzuki | |
| 2015/0277073 A1* | 10/2015 | Johnson | G02B 6/44 |
| | | | 165/104.31 |
| 2016/0072254 A1 | 3/2016 | Suzuki | |

FOREIGN PATENT DOCUMENTS

| | | |
|---|---|---|
| CN | 103155309 A | 6/2013 |
| JP | H07221373 A | 8/1995 |
| JP | 2000-263270 A | 9/2000 |
| JP | 2002045371 A | 2/2002 |
| JP | 2004235567 A | 8/2004 |
| JP | 2007322493 A | 12/2007 |
| JP | 2009-103838 A | 5/2009 |
| JP | 2015141404 A | 3/2015 |
| WO | 2012056566 A1 | 3/2014 |

\* cited by examiner

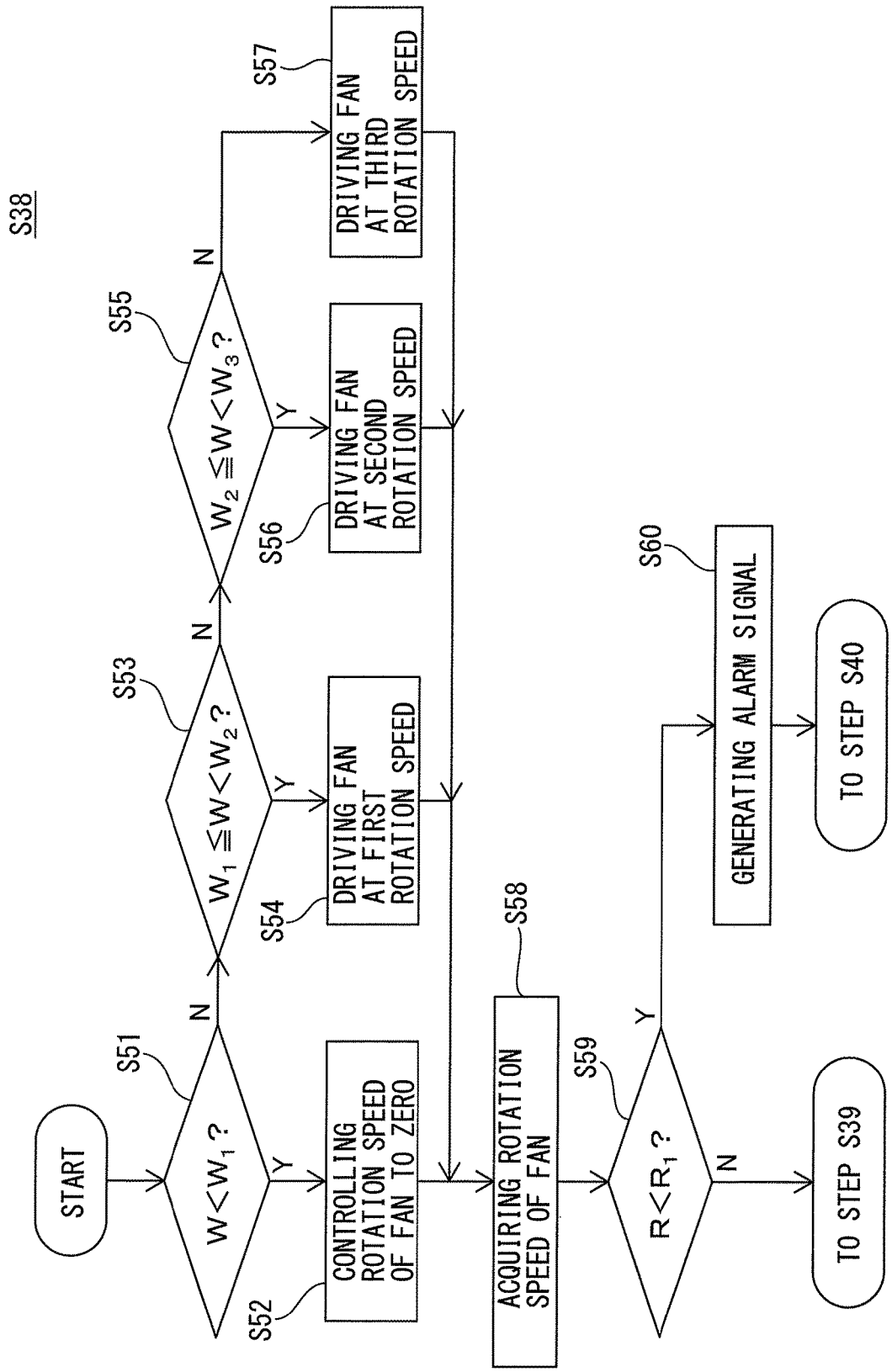

OPTICAL FIBER CONNECTION UNIT HAVING CIRCULATION PATH FOR ALLOWING COOLANT TO CIRCULATE

BACKGROUND OF THE INVENTION

1. Field of the Invention

The invention relates to an optical fiber connection unit provided with a circulation path for allowing coolant to circulate.

2. Description of the Related Art

Optical fiber connection adapters for optically connecting a plurality of optical fibers to one another have been known (for example, Patent Document 1). Further, devices having a laser beam path selecting means for selectively guiding an incident laser beam to a plurality of optical fibers have been known (for example, Japanese Unexamined Patent Publication (Kokai) Nos. 2009-103838 and 2000-263270).

In a laser machining system, an optical fiber connection unit for relaying a laser beam generated by a laser oscillator to an optical fiber is used. In such an optical fiber connection unit, the received laser beam can generate heat in components of the optical fiber connection unit. Conventionally, a technology for efficiently eliminating heat generated in the optical fiber connection unit without contaminating optical components due to, for example, water leakage has been required.

Further, it has conventionally been necessary to monitor and control the ambient temperature, humidity, and coolant temperature, to prevent dew condensation from occurring when a cooling operation is performed. When coolant is introduced from the outside, it is required to lay a member, such as a coolant supply pipe, and accordingly, a location where an optical fiber connection unit is installed is restricted. Thus, an optical fiber connection unit, an installation location of which is not restricted, has been required.

SUMMARY OF THE INVENTION

An optical fiber connection unit which receives a laser beam and relays it to an optical fiber includes a closed circulation path, through which a coolant for removing heat generated in the optical fiber connection unit due to the laser beam propagating through the optical fiber connection unit circulates, and a coolant circulation device which flows the coolant so as to circulate in the circulation path.

The optical fiber connection unit may further include a main body which holds an optical member which condenses the laser beam. The circulation path may be defined by a hole formed at the main body or a pipe attached to the main body.

The optical fiber connection unit may further include a heat radiation fin arranged to be adjacent to the circulation path. The optical fiber connection unit may further include a fan which generates airflow which removes heat from the optical fiber connection unit.

The optical fiber connection unit may further include a temperature detecting part which detects a temperature of the optical fiber connection unit, and a fan controller which controls the fan based on the temperature detected by the temperature detecting part. The optical fiber connection unit may further include a fan controller which controls the fan based on a laser oscillation command transmitted from a laser oscillator controller to a laser oscillator.

The optical fiber connection unit may further include a fan monitor which monitors an operation of the fan. The optical fiber connection unit may further include a circulation device monitor which monitors an operation of the coolant circulation device.

BRIEF DESCRIPTION OF THE DRAWINGS

The above and other objects, features, and advantages of the invention will be clarified from the detailed description of embodiments shown in the accompanying drawings, in which:

FIG. 15 is a flow chart of an example of the flow of step S38 in FIG. 14.

DETAILED DESCRIPTION

Figure 1:
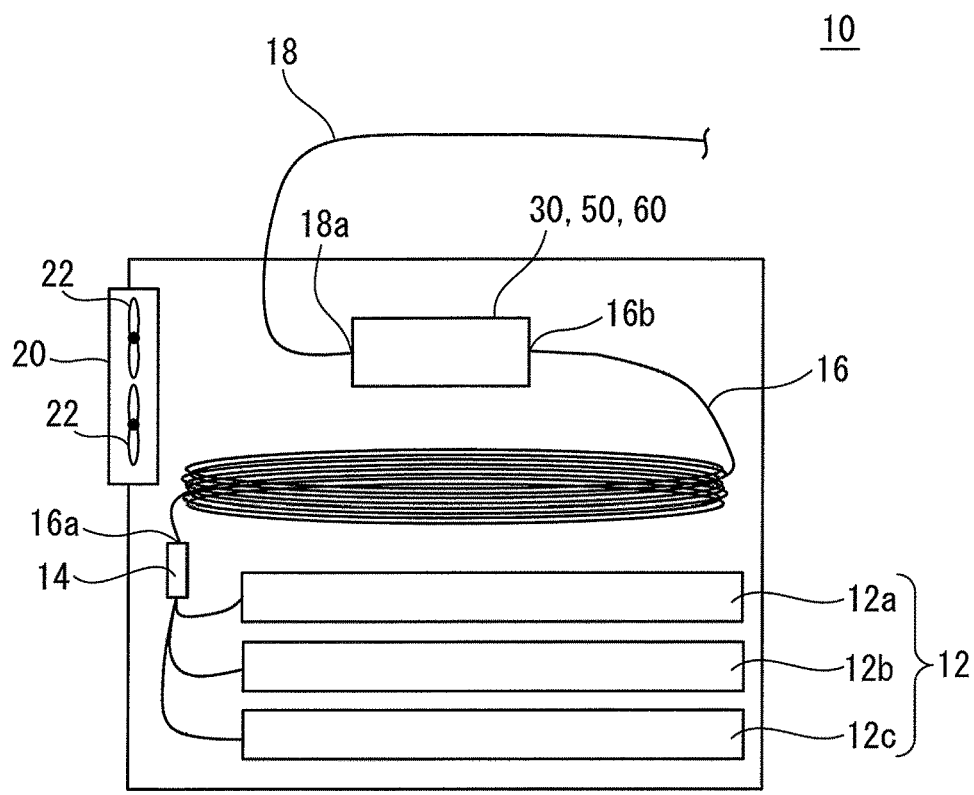
FIG. 1 is a view of a laser oscillator according to an embodiment.

Embodiments of the invention will be described below in detail with reference to the drawings. First, with reference to FIG. 1, a laser oscillator 10 according to an embodiment will be described. The laser oscillator 10 includes a resonator part 12, a beam combiner 14, a first optical fiber 16, a second optical fiber 18, a temperature adjustment device 20, and an optical fiber connection unit 30.

The resonator part 12 has a plurality of laser diode modules 12a, 12b, and 12c. Each of the laser diode modules 12a, 12b, and 12c generates a laser beam, and emits the generated laser beam to the beam combiner 14.

The beam combiner 14 receives the laser beam emitted from the laser diode modules 12a, 12b, and 12c, and combines them. The beam combiner 14 guides the combined laser beam to the first optical fiber 16.

The first optical fiber 16 has a predetermined core diameter (e.g., 100 μm), and propagates the laser beam through its core. A first end 16a of the first optical fiber 16 is welded to the beam combiner 14, while a second end 16b of the first optical fiber 16 is connected to the optical fiber connection unit 30.

The second optical fiber 18 has a core diameter (e.g., 200 μm) different from that of the first optical fiber 16, and propagates the laser beam through its core. A first end 18a of the second optical fiber 18 is connected to the optical fiber connection unit 30, while a second end (not shown) of the second optical fiber 18 is connected to an external optical component (not shown) installed outside of the laser oscillator 10.

The temperature adjustment device 20 has a plurality of fans 22, and generates airflow within the laser oscillator 10 in accordance with a command from a laser oscillator controller (not shown) which controls the laser oscillator 10.

In this embodiment, the optical fiber connection unit 30 is arranged so as to receive the airflow generated by the temperature adjustment device 20. The heat of the optical fiber connection unit 30 is removed by the airflow generated by the temperature adjustment device 20.

The optical fiber connection unit 30 will now be described with reference to FIG. 2. The optical fiber connection unit 30 optically interconnects the first optical fiber 16 and the second optical fiber 18, and relays the laser beam propagating through the first optical fiber 16 to the second optical fiber 18.

The optical fiber connection unit 30 includes a main body 32, optical members 34, a circulation path 36, and a coolant circulation device 38. The main body 32 is a hollow member and defines a light path of the laser beam inside thereof. The main body 32 holds the optical members 34 therein.

A first connector part 40 is provided at a first end 32a of the main body 32. The second end 16b of the first optical fiber 16 is connected to the first connector part 40. The laser beam propagating through the first optical fiber 16 is emitted into the main body 32.

On the other hand, a second connector part 42 is provided at a second end 32b of the main body 32. The first end 18a of the second optical fiber 18 is connected to the second connector part 42. The second optical fiber 18 receives the laser beam passing through the optical members 34, and propagates it to the external optical component outside of the laser oscillator 10.

The optical members 34 include e.g. a collimation lens, and is arranged on the light path of the laser beam A defined in the main body 32. The optical members 34 collimate and condense the laser beam emitted from the first optical fiber 16 into the main body 32, and guide it to the second optical fiber 18.

The circulation path 36 is a closed-flow path for circulating a liquid or gas coolant. In this embodiment, the circulation path 36 is defined by a hole formed at the main body 32, and annularly extends so as to surround the optical members 34. The coolant includes e.g. water, long-life coolant, or solution to which an anticorrosion material is added.

The coolant circulation device 38 is e.g. an electric pump, and includes a rotor arranged in the circulation path 36 and a motor which rotates the rotor. In this embodiment, the coolant circulation device 38 operates when the temperature adjustment device 20 of the laser oscillator 10 is in operation. The coolant circulation device 38 generates pressure fluctuations in a fluid enclosed and sealed in the circulation path 36 so as to cause the fluid in the circulation path 36 to flow. Due to this, the coolant circulates through the circulation path 36.

Thus, the circulation path 36 is a closed-flow path, which can enclose and seal a fluid therein and can circulate the enclosed fluid when the enclosed fluid is caused to flow, without being fluidly connected to an external instrument (e.g., a coolant supply device) installed outside of the optical fiber connection unit 30.

When the laser beam A propagating through the main body 32 enters each optical member 34, a part of the entered laser beam is absorbed by the optical member 34, as a result of which, the optical member 34 generates heat. In order to remove the thus-generated heat, the coolant is enclosed in the circulation path 36, and circulated in the circulation path 36 by the coolant circulation device 38.

Next, an optical fiber connection unit 50 according to another embodiment will be described with reference to FIG. 3. Note that, in various embodiments described below, elements similar to those of the already-mentioned embodiments are assigned the same reference numerals, and the detailed descriptions thereof will be omitted.

The optical fiber connection unit 50 can be applied to the laser oscillator 10 shown in FIG. 1, instead of the optical fiber connection unit 30. The optical fiber connection unit 50 optically interconnects the first optical fiber 16 and the second optical fiber 18, and relays the laser beam propagating through the first optical fiber 16 to the second optical fiber 18.

The optical fiber connection unit 50 includes a main body 52, the optical members 34, a circulation path 54, and the coolant circulation device 38. The main body 52 is a hollow member which defines the light path of the laser beam A inside thereof.

The main body 52 holds the optical members 34 therein. The first connector part 40 is provided at a first end 52a of the main body 52, while the second connector part 42 is provided at a second end 52b of the main body 52.

Similar to the above-mentioned circulation path 36, the circulation path 54 is a closed-flow path for circulating the coolant. In this embodiment, the circulation path 54 is defined by a pipe which is separate from the main body 52 and which is attached to an outer periphery of the main body 52. The circulation path 54 annularly extends so as to surround the optical members 34. The coolant circulation device 38 circulates the fluid enclosed in the circulation path 54.

Next, an optical fiber connection unit 60 according to still another embodiment will be described with reference to FIG. 4. The optical fiber connection unit 60 can be applied to the laser oscillator 10 shown in FIG. 1, instead of the optical fiber connection unit 30.

The optical fiber connection unit 60 optically interconnects the first optical fiber 16 and the second optical fiber 18, and relays the laser beam propagating through the first optical fiber 16 to the second optical fiber 18.

The optical fiber connection unit 60 includes a main body 62, the optical members 34, a circulation path 64, heat radiation fins 67 and 69, and the coolant circulation device 38. The main body 62 is a hollow member which defines the light path of the laser beam A inside thereof.

The main body 62 holds the optical members 34 therein. The first connector part 40 is provided at a first end 62a of the main body 62, while the second connector part 42 is provided at a second end 62b of the main body 62.

The circulation path 64 is a closed-flow path for circulating the coolant. In this embodiment, the circulation path 64 includes a flow path 64a, a flow path 64b, a flow path 64c, a flow path 64d, a flow path 64e, a flow path 64f, a flow path 64g, and a flow path 64h.

The flow path 64a is defined by a hole formed at the main body 62. The flow path 64b is defined by a pipe separated from the main body 62 and the first connector part 40, and is fluidly connected to the flow path 64a and the flow path 64c.

The flow path 64c is defined by a hole formed at the first connector part 40 around the first optical fiber 16. The flow path 64d is defined by a pipe separated from the main body 62 and the first connector part 40, and is fluidly connected to the flow path 64c and the flow path 64e.

The flow path 64e is defined by a hole formed at the main body 62. The flow path 64e is arranged so as to pass through a region different from the flow path 64a. In this embodiment, the flow paths 64a and 64e are arranged so as to pass the vicinity of all optical members 34.

The flow path 64f is defined by a pipe separated from the main body 62 and the second connector part 42, and is fluidly connected to the flow path 64e and the flow path 64g. The flow path 64g is defined by a hole formed at the second connector part 42 around the second optical fiber 18.

The flow path 64h is a pipe separated from the main body 62 and the second connector part 42, and is fluidly connected to the flow path 64a and the flow path 64g. These flow paths 64a to 64h are in fluid communication with each other, and form the closed-circulation path 64.

The heat radiation fins 67 and 69 are mounted on an outer peripheral surface of the main body 62. Specifically, the heat radiation fin 67 is arranged to be adjacent to the flow path 64a, and remove heat mainly from the coolant flowing through the flow path 64a. On the other hand, the heat radiation fin 69 is arranged to be adjacent to the flow path 64e, and remove heat mainly from the coolant flowing through the flow path 64e.

In the above-mentioned optical fiber connection units 30, 50, and 60, each of the circulation paths 36, 54, and 64 is configured as a closed-flow path. Accordingly, the coolant can be circulated in the optical fiber connection unit 30, 50, 60, by operating the coolant circulation device 38. Due to this, it is possible to remove heat generated in the optical fiber connection unit 30, 50, 60.

According to this configuration, it is not necessary to supply a coolant to the circulation path 36, 54, 64 from an external instrument (coolant supply device). Therefore, it is not necessary to provide a joint, which connects a coolant supply pipe for supplying a coolant from the external instrument, at the circulation path 36, 54, 64.

Accordingly, a possibility, that the coolant leaks out from the joint due to an operation of removing the coolant supply pipe from the joint or to an attachment defect between the joint and the coolant supply pipe, can be eliminated. Thereby, it is possible to reliably prevent components such as the optical members 34 from being contaminated by the leakage of the coolant.

Further, the coolant is not supplied from the external instrument to the circulation path 36, 54, 64, and therefore, it is not necessary for a user to perform quality control (e.g., pH value control) for coolant supplied from the external instrument. On the other hand, the user can easily control the quality of the coolant by periodically changing the coolant in the circulation path 36, 54, 64.

Further, in the optical fiber connection units 30 and 50, the circulation paths 36 and 54 are arranged so as to surround the optical members 34. According to this configuration, it is possible to effectively cool a portion which is apt to be heated by the laser beam propagating through the optical fiber connection units 30 and 50.

Further, in the optical fiber connection unit 60, the flow paths 64a and 64e are arranged so as to pass the vicinity of the optical members 34. According to this configuration, it is possible to effectively cool a portion which is apt to be heated by the laser beam propagating through the optical fiber connection unit 60.

Further, in the optical fiber connection unit 60, the heat radiation fins 67 and 69 are respectively arranged to be adjacent to the flow paths 64a and 64e. According to this configuration, it is possible to effectively cool a portion which is apt to be heated by the laser beam propagating through the optical fiber connection unit 60.

Further, in the optical fiber connection unit 60, the heat is removed from the coolant flowing through the circulation path 64 by the heat radiation fins 67 and 69, in a so-called air cool manner. According to this configuration, since the temperature of the components of the optical fiber connection unit 60 does not decrease to a temperature equal to or lower than the dew point, it is possible to prevent dew condensation in the components of the optical fiber connection unit 60.

Note that, the circulation path 36 of the optical fiber connection unit 30 and the flow paths 64a and 64e of the optical fiber connection unit 60 may be defined by pipes embedded in the main bodies 32 and 62. The pipes may be made of metal such as copper, or resin such as nylon.

Next, a laser oscillator 70 according to another embodiment will be described with reference to FIGS. 5 to 7. The laser oscillator 70 is e.g. a YAG oscillator, and includes a resonator part 72, an amplifier part 74, and an optical fiber connection unit 100.

The resonator part 72 includes an output mirror 76, a rear mirror 78, a semiconductor laser 80a, and a YAG rod 80b. The resonator part 72 generates a laser beam in accordance with a command from a laser oscillator controller (not shown), and emits the generated laser beam from the output mirror 76.

The amplifier part 74 includes a plurality of mirrors 82, 84, 86, and 88. The mirrors 82, 84, 86, and 88 form a light path of the laser beam A emitted from the output mirror 76, and guide it to the optical fiber connection unit 100.

Figure 6:
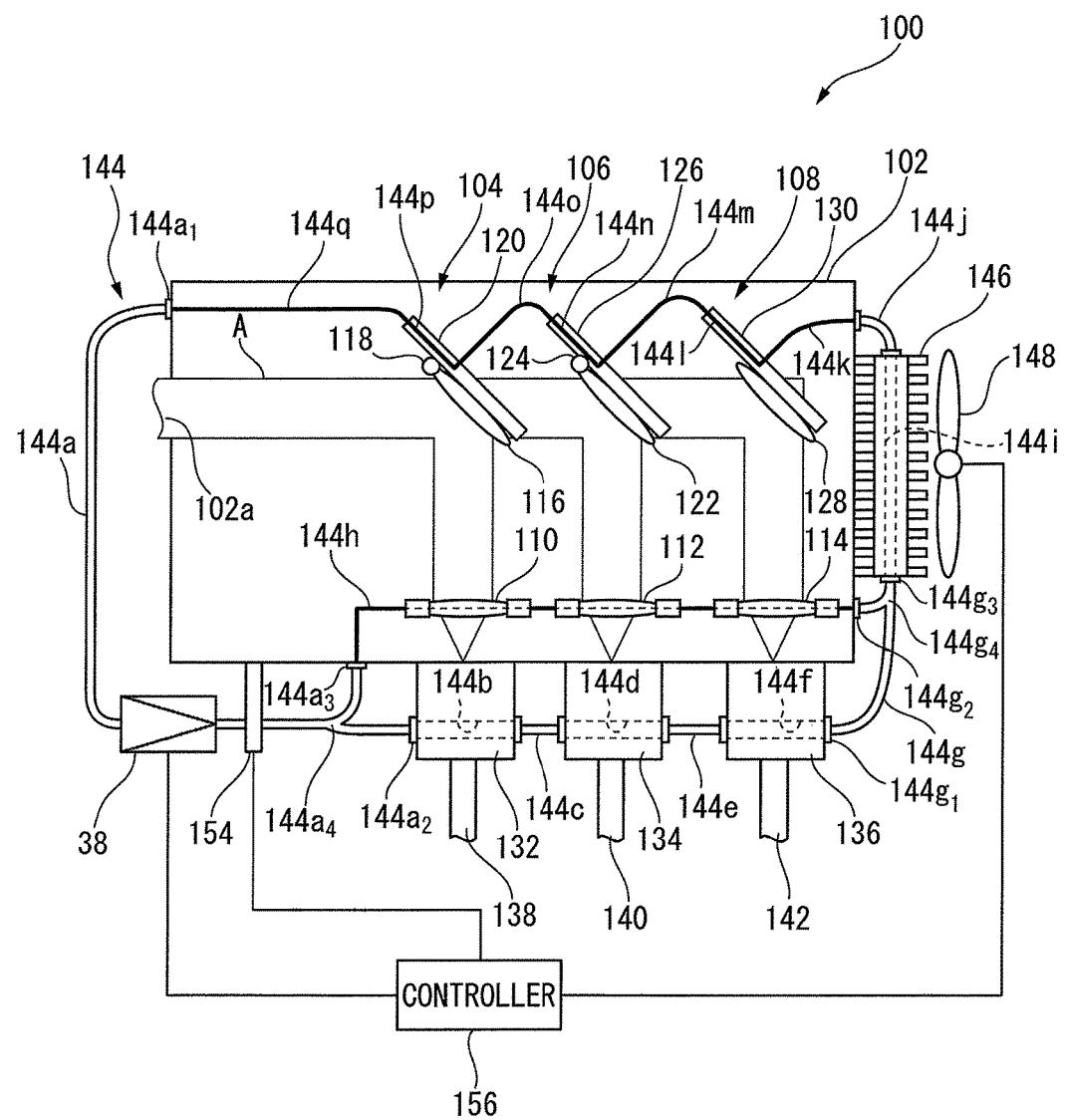
FIG. 6 is a view of the optical fiber connection unit shown in FIG. 5.
Figure 7:
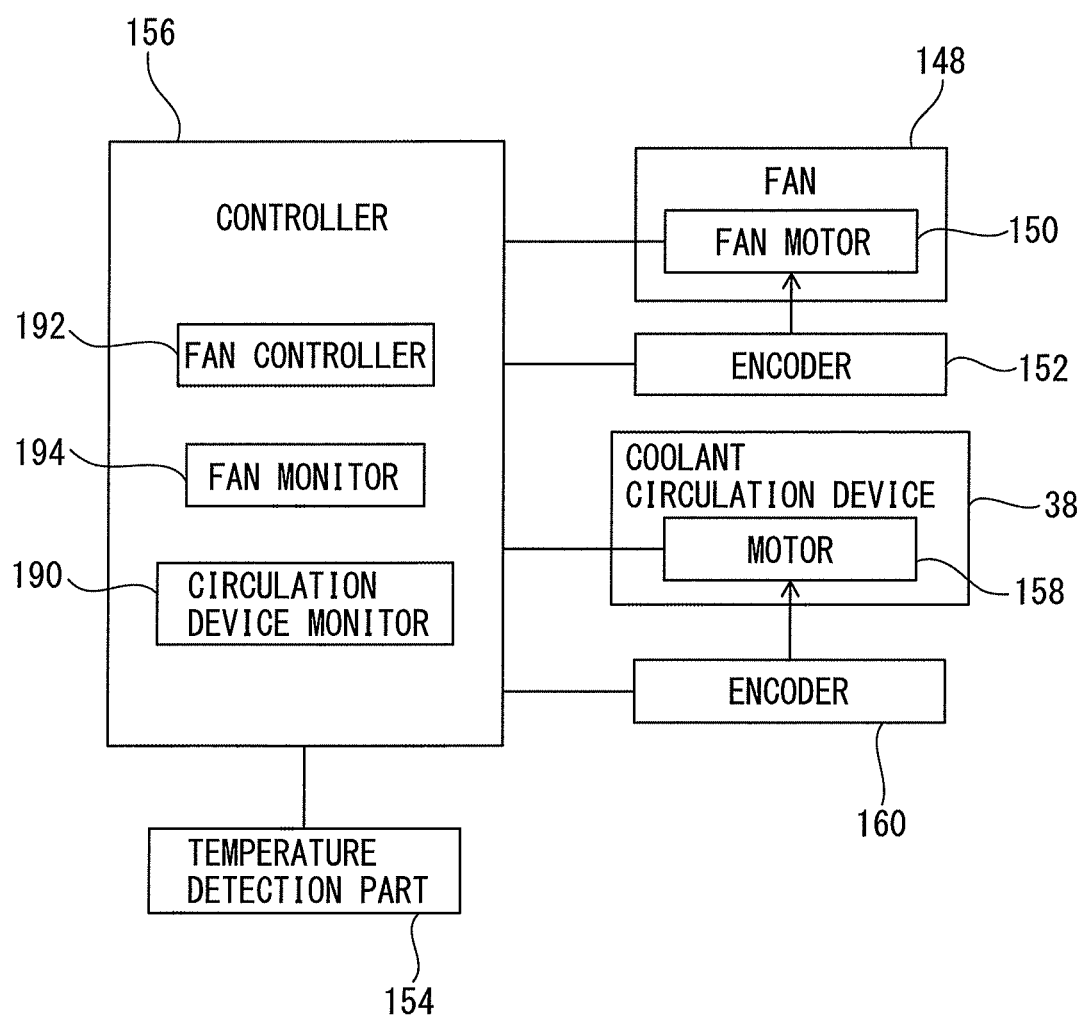
FIG. 7 is a block diagram of the optical fiber connection unit shown in FIGS. 6 and 9.

As shown in FIG. 6, the optical fiber connection unit 100 includes a main body 102, shutter units 104, 106, and 108, and condenser lenses 110, 112, and 114.

The main body 102 is a hollow member having an opening 102a, and holds therein optical members, such as the shutter units 104, 106 and 108, and the condenser lenses 110, 112 and 114. The laser beam A propagating from the mirror 88 of the amplifier part 74 enters into the main body 102 through the opening 102a.

The shutter unit 104 includes a mirror 116, a mirror driving part 118, and a coolant jacket 120. The mirror 116 is arranged so as to move between a blocking position, in which the mirror 116 blocks an optical path of the laser beam A entering from the opening 102a, and a retracted position in which the mirror 116 is retracted from the light path.

When the mirror 116 is arranged at the blocking position, the laser beam A entering from the opening 102a is reflected by the mirror 116 and guided to the condenser lens 110. On the other hand, when the mirror 116 is arranged at the retracted position, the laser beam A entering from the opening 102a passes through the shutter unit 104 so as to propagate toward the shutter unit 106.

The mirror driving part 118 includes e.g. a servomotor, and moves the mirror 116 between the blocking position and the retracted position in accordance with a command from the laser oscillator controller (not shown). The coolant jacket 120 is arranged to be adjacent to the mirror 116. A hole for flowing a coolant is formed inside of the coolant jacket 120.

The shutter unit 106 has a configuration similar to that of the shutter unit 104. Specifically, the shutter unit 106 includes a mirror 122, a mirror driving part 124, and a coolant jacket 126.

The mirror 122 is arranged so as to move between a blocking position, in which the mirror 122 blocks the light path of the laser beam A passing through the shutter unit 104 when the mirror 116 of the shutter unit 104 is arranged at the retracted position, and an retracted position, in which the mirror 122 is retracted from the light path.

When the mirror 116 is arranged at the retracted position and the mirror 122 is arranged at the blocking position, the laser beam A entering into the main body 102 is reflected by the mirror 122, and guided to the condenser lens 112. On the other hand, when the mirrors 116 and 122 are arranged at the retracted positions, the laser beam A entering into the main body 102 passes through the shutter units 104 and 106 so as to propagate toward the shutter unit 108.

The mirror driving part 124 moves the mirror 122 between the retracted position and the blocking position. The coolant jacket 126 is arranged to be adjacent to the mirror 122. A hole for flowing the coolant is formed inside of the coolant jacket 126.

The shutter unit 108 includes a mirror 128 and a coolant jacket 130. The mirror 128 is fixed at a position in which the mirror 128 blocks the light path of the laser beam A passing through the shutter unit 106 when the mirror 122 of the shutter unit 106 is arranged at the retracted position.

The laser beam A incident on the mirror 128 is reflected toward the condenser lens 114. The coolant jacket 130 is arranged to be adjacent to the mirror 128. A hole for flowing the coolant is formed inside of the coolant jacket 130.

The condenser lenses 110, 112, and 114 respectively condense the laser beam reflected by the mirrors 116, 122, and 128, and guide the condensed laser beam to optical fibers 138, 140, and 142.

Connector parts 132, 134, and 136 are provided at the main body 102. An end of the optical fiber 138 is connected to the connector part 132. The optical fiber 138 receives the laser beam condensed by the condenser lens 110, and propagates it to an external optical component outside of the laser oscillator 70.

Similarly, an end of the optical fiber 140 is connected to the connector part 134. The optical fiber 140 receives the laser beam condensed by the condenser lens 112, and propagates it to the external optical component.

Similarly, an end of the optical fiber 142 is connected to the connector part 136. The optical fiber 142 receives the laser beam condensed by the condenser lens 114, and propagates it to the external optical component.

Thus, the optical fiber connection unit 100 selectively guides the laser beam A generated by the resonator part 72 to any one of a total of three optical fibers 138, 140, and 142, in accordance with a command from the laser oscillator controller (not shown).

The optical fiber connection unit 100 further includes a circulation path 144, a heat radiation fin 146, a fan 148, a coolant circulation device 38, a temperature detecting part 154, and a controller 156. The circulation path 144 is a closed-flow path for circulating the coolant.

Specifically, the circulation path 144 includes flow paths 144a, 144b, 144c, 144d, 144e, 144f, 144g, 144h, 144i, 144j, 144k, 144l, 144m, 144n, 144o, 144p, and 144q.

The flow path 144a is defined by a pipe separated from the main body 102. The flow path 144a has a tri-furcation part $144a_4$, wherein a first end $144a_1$ of the flow path 144a is fluidly connected to the flow path 144q, a second end $144a_2$ of the flow path 144a is fluidly connected to the flow path 144b, and a third end $144a_3$ of the flow path 144a is fluidly connected to the flow path 144h.

The flow path 144b is defined by a hole formed at the connector part 132 around the optical fiber 138. The flow path 144c is defined by a pipe separated from the connector parts 132 and 134, and is fluidly connected to the flow paths 144b and 144d.

The flow path 144d is defined by a hole formed at the connector part 134 around the optical fiber 140. The flow path 144e is defined by a pipe separated from the connector parts 134 and 136, and is fluidly connected to the flow paths 144d and 144f.

The flow path 144f is defined by a hole formed at the connector part 136 around the optical fiber 142. The flow path 144h is defined by a hole formed at the main body 102. The flow path 144h extends so as to pass the vicinity of each of the condenser lenses 110, 112, and 114. One end of the flow path 144h is fluidly connected to the flow path 144a, while the other end of the flow path 144h is fluidly connected to the flow path 144g.

The flow path 144g is defined by a pipe separated from the connector part 136 and the main body 102. The flow path 144g has a tri-furcation part $144g_4$, wherein a first end $144g_1$ of the flow path 144g is fluidly connected to the flow path 144f, a second end $144g_2$ of the flow path 144g is fluidly connected to the flow path 144h, and a third end $144g_3$ of the flow path 144g is fluidly connected to the flow path 144i.

The flow path 144i is defined by a hole formed at the heat radiation fin 146 so as to extend through the heat radiation fin 146. The flow path 144j is defined by a pipe separated from the main body 102 and the heat radiation fin 146, and is fluidly connected to the flow paths 144i and 144k.

Each of the flow paths 144k, 144m, 144o, and 144q is defined by a hole formed at the main body 102. On the other hand, the flow paths 144l, 144n, and 144p are respectively defined by holes formed at inside of the coolant jackets 130, 126, and 120.

Thus, in this embodiment, portions of the circulation path 144 are formed at the components of the shutter units 104, 106, and 108 (i.e., the coolant jackets 130, 126, and 120).

The flow paths 144l, 144n, and 144p are formed to have equivalent diameters (sectional areas) greater than those of the flow paths 144k, 144m, 144o, and 144q. Accordingly, Each of the flow paths 144l, 144n, and 144p functions as a coolant pool capable of temporarily storing the coolant flowing through the circulation path 144. The flow paths 144a to 144q are in fluid communication with each other, and form the closed-circulation path 144.

The heat radiation fin 146 is mounted on an outer surface of the main body 102. As described above, the heat radiation fin 146 is formed with the hole extending therethrough, by which the flow path 144i is defined.

The fan 148 is arranged to be adjacent to the heat radiation fin 146. The fan 148 includes a rotor (not shown) having a plurality of vanes, and a fan motor 150 (FIG. 7) which rotates the rotor. The fan 148 is arranged to generate airflow in the heat radiation fin 146.

An encoder 152 (FIG. 7) is attached to the fan 148. The encoder 152 detects a rotation speed of the rotor of the fan 148, and transmits data of the rotation speed to the controller 156.

The temperature detecting part 154 has e.g. a thermocouple or a platinum resistance temperature detector, and is attached to the main body 102. The temperature detecting part 154 detects a temperature of a portion where the temperature detecting part 154 is arranged, and transmits data of the temperature to the controller 156.

The coolant circulation device 38 includes a rotor (not shown) arranged in the flow path 144a, and a motor 158

(FIG. 7) which rotates the rotor. The motor 158 is e.g. a servomotor, and rotates the rotor in accordance with a command from the controller 156. Thus, the coolant circulation device 38 generates pressure fluctuations in the fluid enclosed in the circulation path 144 so as to circulate the fluid in the circulation path 144.

An encoder 160 (FIG. 7) is attached to the coolant circulation device 38. The encoder 160 detects a rotation speed of the rotor of the coolant circulation device 38, and transmits data of the rotation speed to the controller 156.

The controller 156 has e.g. a CPU and a storage (not shown), and controls the fan motor 150 and the motor 158 of the coolant circulation device 38. The controller 156 can be attached to the main body 102.

In this embodiment, the controller 156 controls the rotation speed of the fan 148 based on the temperature detected by the temperature detecting part 154. This operation will be described later.

Figure 8:
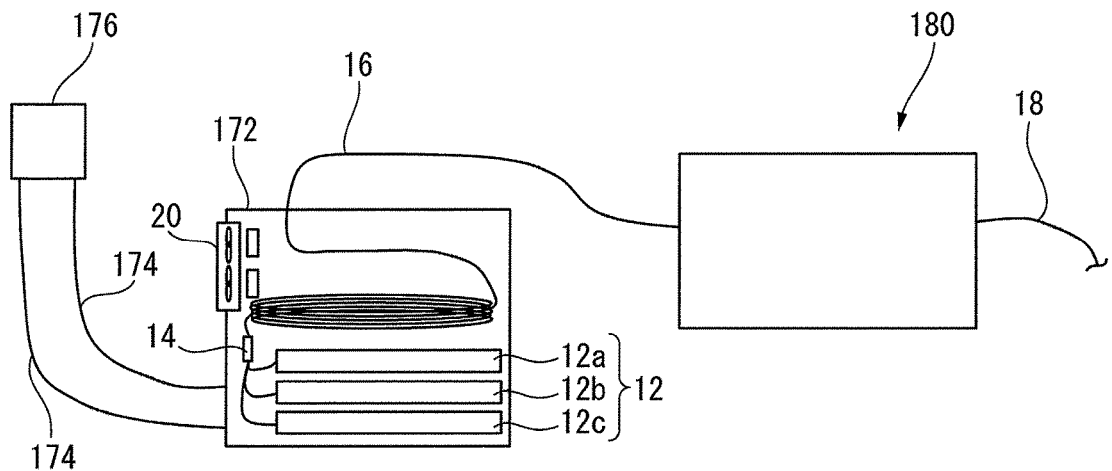
FIG. 8 is a view of a laser machining system according to an embodiment.

Next, a laser machining system 170 according to an embodiment will be described with reference to FIG. 8. The laser machining system 170 includes a laser oscillator 172 and an optical fiber connection unit 180.

The laser oscillator 172 includes the resonator part 12, the beam combiner 14, the first optical fiber 16, and the temperature adjustment device 20, similar to the above mentioned laser oscillator 10. A coolant supply pipe 174 is connected to the laser oscillator 172.

The coolant supply pipe 174 is also connected to a coolant supply device 176 installed outside of the laser oscillator 172. The coolant supply device 176 supplies coolant to a coolant flow path (not shown) formed in the laser oscillator 172 via the coolant supply pipe 174, so as to cool the laser oscillator 172.

Next, the optical fiber connection unit 180 will be described with reference to FIGS. 7 and 9. The optical fiber connection unit 180 relays the laser beam propagating through the first optical fiber 16 of the laser oscillator 172 to the second optical fiber 18.

The optical fiber connection unit 180 is different from the above-mentioned optical fiber connection unit 60 in the feature wherein the optical fiber connection unit 180 further includes the fan 148, the temperature detecting part 154, and the controller 156.

In this embodiment, the fan 148 is arranged to be adjacent to the heat radiation fin 67. The fan 148 is arranged to generate airflow in the heat radiation fin 67. The temperature detecting part 154 is attached to the main body 62.

The controller 156 controls the rotation speed of the fan 148 based on the temperature detected by the temperature detecting part 154. The controller 156 can be attached to the main body 62.

Figure 10:
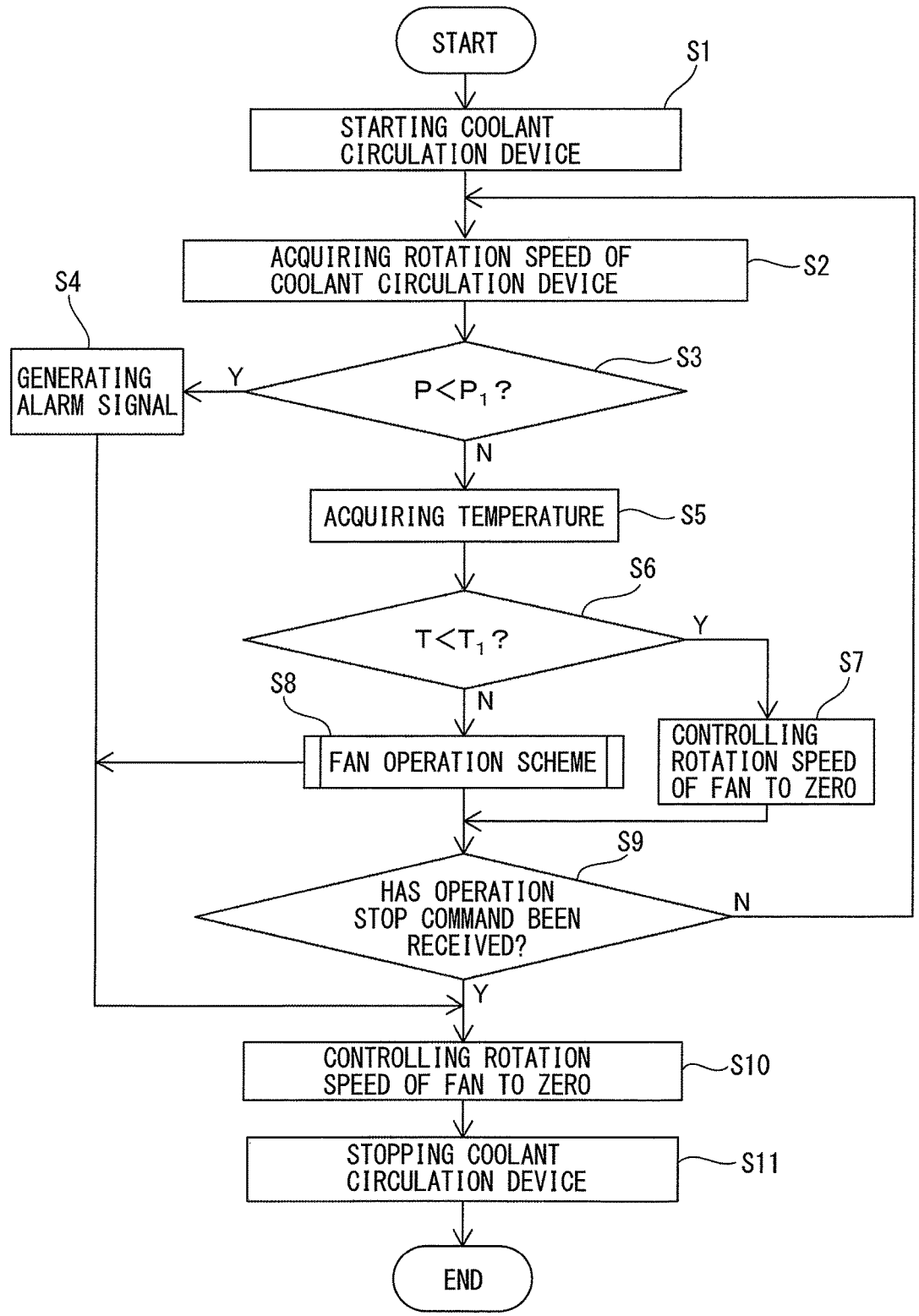
FIG. 10 is a flow chart of an example of the operation flow of the optical fiber connection unit shown in FIG. 7.

Next, operations of the optical fiber connection units 100 and 180 will be described with reference to FIGS. 7 and 10. The flow shown in FIG. 10 is started when the controller 156 receives an operation command from e.g. a user, a host controller, or a laser machining program.

At step S1, the controller 156 starts the operation of the coolant circulation device 38. Specifically, the controller 156 transmits a rotation command to the motor 158 so as to rotate the rotor of the coolant circulation device 38 at a predetermined rotation speed $P_0$. Due to this, the fluid enclosed in the circulation paths 144 and 64 flows in the circulation paths 144 and 64 so as to circulate there.

At step S2, the controller 156 acquires a rotation speed P of the coolant circulation device 38.

Specifically, the controller 156 transmits a command to the encoder 160 so as to detect the rotation speed P of the rotor of the coolant circulation device 38. The controller 156 acquires data of the detected rotation speed P from the encoder 160.

At step S3, the controller 156 determines whether the rotation speed P acquired at step S2 is smaller than a predetermined threshold value $P_1$ of the rotation speed (i.e., $P<P_1$).

The threshold value $P_1$ is a lower limit ($0<P_1<P_0$) of the rotation speed P, for which the coolant circulation device 38 can be estimated to normally operate. The threshold value $P_1$ is predetermined by a user, and stored in the storage of the controller 156. As an example, the threshold value $P_1$ is set to be 50% of the rotation speed $P_0$ transmitted to the motor 158 at step S1.

The controller 156 proceeds to step S4 when determining that $P<P_1$ is satisfied (i.e., determining "YES"). On the other hand, the controller 156 proceeds to step S5 when determining that is satisfied (i.e., determining "NO").

At step S4, the controller 156 generates an alarm signal. For example, the controller 156 generates an alarm signal in the form of an image or a sound representing "Abnormality occurs in operation of coolant circulation device". Then, the controller 156 transmits the generated alarm signal to a display or a speaker (not shown) so as to notify the user of the alarm via the display or the speaker.

Thus, in this embodiment, the controller 156 monitors the rotation speed P of the coolant circulation device 38 at steps S2 and S3, and outputs an alarm to the user at step S4 when an abnormality occurs in the rotation (it is determined "YES" at step S3). Accordingly, the controller 156 functions as a circulation device monitor 190 (FIG. 7) which monitors the operation of the coolant circulation device 38.

At step S5, the controller 156 acquires a temperature T of the optical fiber connection unit 100, 180. Specifically, the controller 156 transmits a command to the temperature detecting part 154 so as to detect the temperature T of the optical fiber connection unit 100, 180. The controller 156 acquires data of the temperature T from the temperature detecting part 154.

At step S6, the controller 156 determines whether the temperature T acquired at step S5 is lower than a predetermined threshold value $T_1$ of the temperature (i.e., $T<T_1$). The threshold value $T_1$ is a lower limit of the temperature of the optical fiber connection unit 100, 180, at which it is not necessary to operate the fan 148. The threshold value $T_1$ is predetermined by a user, and stored in the storage of the controller 156.

The controller 156 proceeds to step S7 when determining that $T<T_1$ is satisfied (i.e., determining "YES"). On the other hand, the controller 156 proceeds to step S8 when determining that $T \geq T_1$ is satisfied (i.e., determining "NO").

At step S7, the controller 156 controls the rotation speed R of the fan 148 to zero. Specifically, the controller 156 transmits a command to the fan motor 150 so as to stop the rotation of the fan motor 150.

Figure 11:
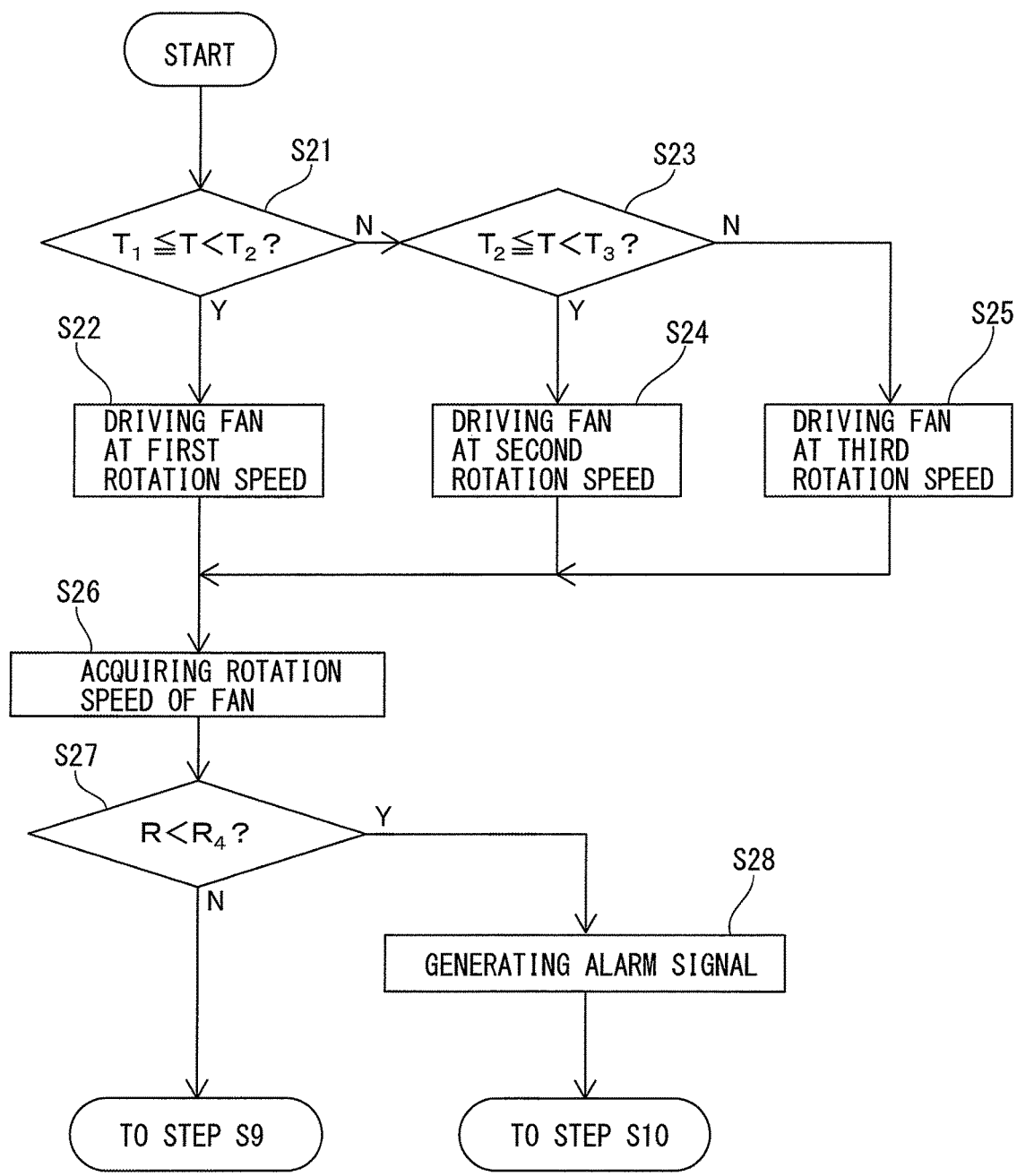
FIG. 11 is a block diagram of an example of the flow of step S8 in FIG. 10.

At step S8, the controller 156 carries out an operation scheme of the fan 148. Step S8 will be described with reference to FIG. 11.

After step S8 is started, at step S21, the controller 156 determines whether the temperature T acquired at step S5 most-recently executed is equal to or higher than the threshold value $T_1$ and is smaller than a predetermined threshold value $T_2$ of the temperature (i.e., $T_1 \leq T < T_2$). The threshold value $T_2$ is predetermined by a user so as to be greater than the threshold value $T_1$, and is stored in the storage of the controller 156.

The controller 156 proceeds to step S22 when determining that $T_1 \leq T < T_2$ is satisfied (i.e., determining "YES"). On the other hand, the controller 156 proceeds to step S23 when determining that $T_2 \leq T$ is satisfied (i.e., determining "NO").

At step S22, the controller 156 drives the fan 148 at a first rotation speed $R_1$. Specifically, the controller 156 generates a first rotation command corresponding to the first rotation speed $R_1$, and transmits it to the fan motor 150. In accordance with the first rotation command, the fan motor 150 drives the rotor of the fan 148 to rotate at the first rotation speed $R_1$.

At step S23, the controller 156 determines whether the temperature T acquired at step S5 most-recently executed is equal to or higher than the threshold value $T_2$ and is smaller than a predetermined threshold value $T_3$ of the temperature (i.e., $T_2 \leq T < T_3$). The threshold value $T_3$ is predetermined by a user so as to be greater than the threshold value $T_2$, and is stored in the storage of the controller 156.

The controller 156 proceeds to step S24 when determining that $T_2 \leq T < T_3$ is satisfied (i.e., determining "YES"). On the other hand, the controller 156 proceeds to step S25 when determining that $T_3 \leq T$ is satisfied (i.e., determining "NO").

At step S24, the controller 156 drives the fan 148 at a second rotation speed $R_2$ ($>R_1$). Specifically, the controller 156 generates a second rotation command corresponding to the second rotation speed $R_2$, and transmits it to the fan motor 150. In accordance with the second rotation command, the fan motor 150 drives the rotor of the fan 148 to rotate at the second rotation speed $R_2$.

At step S25, the controller 156 drives the fan 148 at a third rotation speed $R_3$ ($>R_2$). Specifically, the controller 156 generates a third rotation command corresponding to the third rotation speed $R_3$, and transmits it to the fan motor 150. In accordance with the third rotation command, the fan motor 150 drives the rotor of the fan 148 to rotate at the third rotation speed $R_3$. As an example, the third rotation speed $R_3$ is set to be a maximum acceptable rotation speed of the fan 148.

Thus, in this embodiment, at steps S21 to S25, the controller 156 operates the fan 148 at a rotation speed depending on the temperature T detected by the temperature detecting part 154. Accordingly, the controller 156 functions as a fan controller 192 (FIG. 7) which controls the fan 148 based on the temperature T detected by the temperature detecting part 154.

At step S26, the controller 156 acquires a rotation speed R of the fan 148. Specifically, the controller 156 transmits a command to the encoder 152 so as to detect the rotation speed R of the rotor of the fan 148, and acquires data of the rotation speed R from the encoder 152.

At step S27, the controller 156 determines whether the rotation speed R acquired at step S26 is smaller than a predetermined threshold value $R_4$ of the rotation speed (i.e., $R < R_4$).

The threshold value $R_4$ is a lower limit of the rotation speed R, for which the fan 148 can be estimated to normally operate. The threshold value $R_4$ is predetermined by a user, and stored in the storage of the controller 156. As an example, the threshold value $R_4$ is set to be 50% of the rotation command $R_1$, $R_2$, or $R_3$ transmitted from the controller 156 to the fan motor 150 at step S22, S24, or S25.

The controller 156 proceeds to step S28 when determining that $R < R_4$ is satisfied (i.e., determining "YES"). On the other hand, the controller 156 proceeds to step S9 in FIG. 10 when determining that $R \geq R_4$ is satisfied (i.e., determining "NO").

At step S28, the controller 156 generates an alarm signal. For example, the controller 156 generates an alarm signal in the form of an image or a sound representing "Abnormality occurs in operation of fan". Then, the controller 156 transmits the generated alarm signal to a display or a speaker (not shown) so as to notify a user of the alarm via the display or the speaker.

Thus, in this embodiment, the controller 156 monitors the rotation speed R of the fan 148 at steps S26 and S27, and outputs the alarm to a user at step S28 when an abnormality occurs in the rotation (it is determined "YES" at step S27). Therefore, the controller 156 functions as a fan monitor 194 (FIG. 7) which monitors the operation of the fan 148.

Referring again to FIG. 10, at step S9, the controller 156 determines whether it has received an operation stop command from e.g. a user, a host controller, or a laser machining program.

The controller 156 proceeds to step S10 when determining that it has received the operation stop command (i.e., determining "YES"). On the other hand, the controller 156 returns to step S2 when determining that it has not received the operation stop command (i.e., determining "NO").

At step S10, the controller 156 controls the rotation speed R to zero, similarly to the above-mentioned step S7.

At step S11, the controller 156 stops the coolant circulation device 38. Specifically, the controller 156 transmits a command to the motor 158 of the coolant circulation device 38 so as to stop the motor 158. Then, the controller 156 ends the flow shown in FIG. 10.

As described above, in the optical fiber connection units 100 and 180, each of the circulation paths 144 and 64 is configured as a closed-flow path, and therefore, the coolant can circulate in the optical fiber connection units 100 and 180 by operating the circulation device 38.

According to this configuration, it is not necessary to supply the coolant from the external instrument (coolant supply device) to the circulation paths 144 and 64. Accordingly, it is not necessary to provide a joint, which connects a coolant supply pipe, at the circulation paths 144 and 64.

Therefore, a possibility, that the coolant leaks out due to an operation of removing the coolant supply pipe from the joint or to an attachment defect between the joint and the coolant supply pipe, can be eliminated.

Further, in the optical fiber connection units 100 and 180, the heat is removed from the coolant circulating through the circulation paths 144 and 64 by the fan 148 and the heat radiation fins 146, 67 and 69, in a so-called air cool manner. According to this configuration, since the temperature of the components of the optical fiber connection unit 100, 180 does not decrease below the dew point, it is possible to prevent dew condensation in the components of the optical fiber connection unit 100, 180.

Further, in the optical fiber connection units 100 and 180, the controller 156 detects the temperature T of the optical fiber connection unit 100, 180, and operates the fan 148 at a rotation speed depending on the temperature T (steps S21 to S25). According to this configuration, the operation efficiency of the fan 148 can be optimized, and therefore, it is possible to reduce power consumption.

Further, in the optical fiber connection units 100 and 180, the controller 156 monitors the operation of the fan 148, and, if the controller 156 detects that an abnormality occurs in the operation of the fan 148 (determines "YES" at step S27), the controller 156 warns the user (step S28).

According to this configuration, if foreign substances such as dusts adhere to the rotor of the fan 148 so as to cause a failure that the rotation of the rotor is disturbed, for example, the user can automatically and intuitively recognize the failure. Consequently, the user can quickly take a countermeasure, e.g., replacement or repair of the fan 148.

Further, in optical fiber connection units 100 and 180, the controller 156 monitors the operation of the coolant circulation device 38, and, if the controller 156 detects that an abnormality occurs in the operation of the coolant circulation device 38 (determines "YES" at step S3), the controller 156 warns the user (step S4).

According to this configuration, if foreign substances adhere to the rotor of the coolant circulation device 38 so as to cause a failure that the rotation of the rotor is disturbed, the user can automatically and intuitively recognize the failure. Consequently, the user can quickly take a countermeasure, e.g., replacement or repair of the coolant circulation device 38.

Further, in the optical fiber connection unit 100, coolant pools are provided in the components (i.e., coolant jackets 120, 126, and 130) of the shutter units 104, 106, and 108. According to this configuration, it is possible to effectively remove the heat generated in the mirrors 116, 122, and 128 due to the laser beam A entering the mirrors 116, 122, and 128.

Further, in the optical fiber connection unit 100, the flow path 144h of the circulation path 144 is formed to pass the vicinity of each of the condenser lenses 110, 112, and 114. According to this configuration, it is possible to effectively remove the heat generated in the condenser lenses 110, 112, and 114 due to the laser beam entering the condenser lenses 110, 112, and 114.

Figure 12:
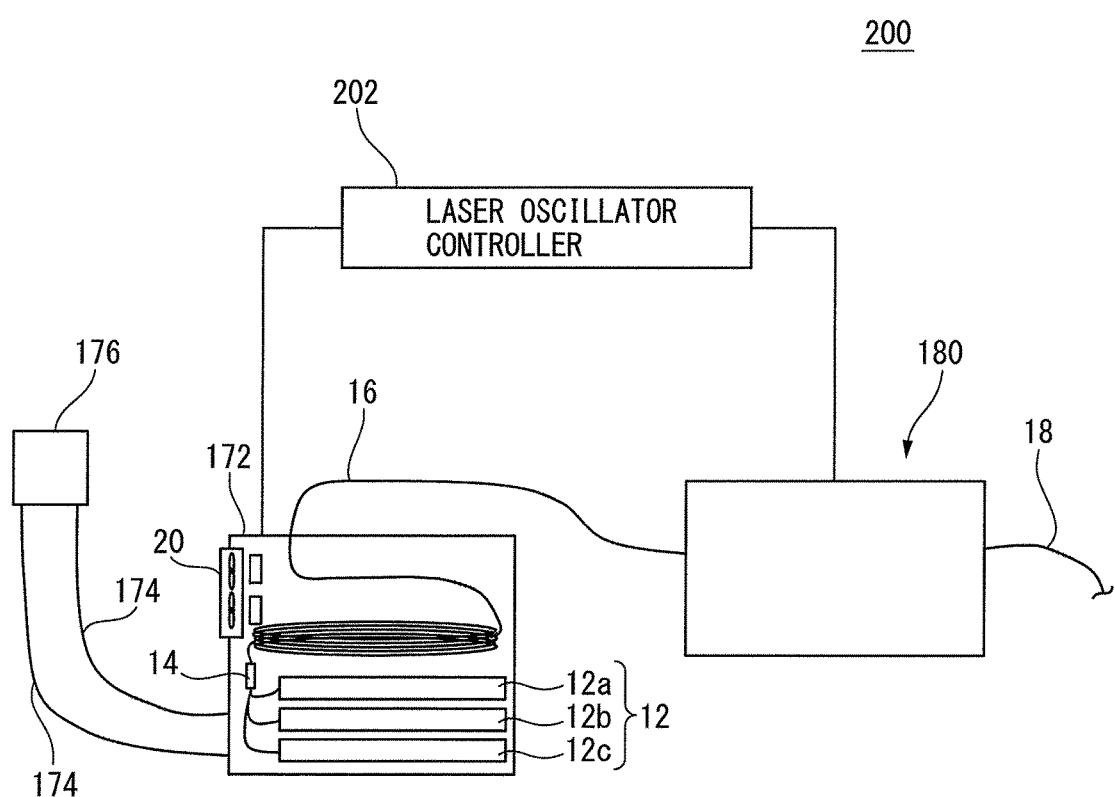
FIG. 12 is a view of a laser machining system according to another embodiment.
Figure 13:
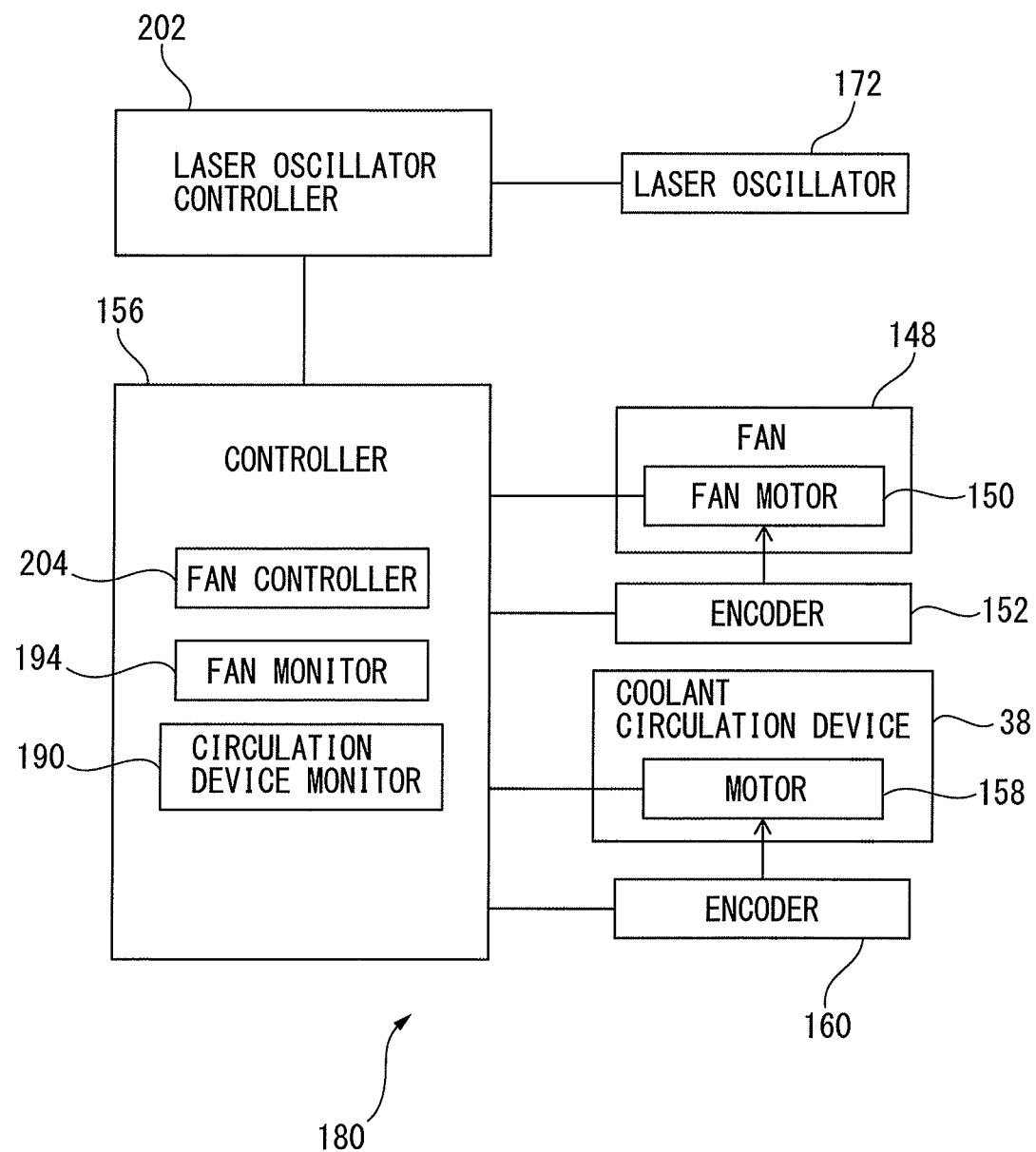
FIG. 13 is a block diagram of the laser machining system shown in FIG. 12.

Next, a laser machining system 200 according to another embodiment will be described with reference to FIGS. 12 and 13. The laser machining system 200 is a direct diode laser (DDL) machining system, and includes the laser oscillator 172, the optical fiber connection unit 180, and a laser oscillator controller 202.

The laser oscillator controller 202 controls a laser beam generating operation of the laser oscillator 172. Specifically, the laser oscillator controller 202 transmits to the laser oscillator 172 a command relating to the laser power of the laser beam to be emitted from the laser oscillator 172, such as a laser output command, a frequency command, or a duty command.

The laser oscillator controller 202 is communicably connected to the controller 156 of the optical fiber connection unit 180. The controller 156 and the laser oscillator controller 202 carry out a laser machining process on a workpiece (not shown), along with communicating with each other.

Figure 14:
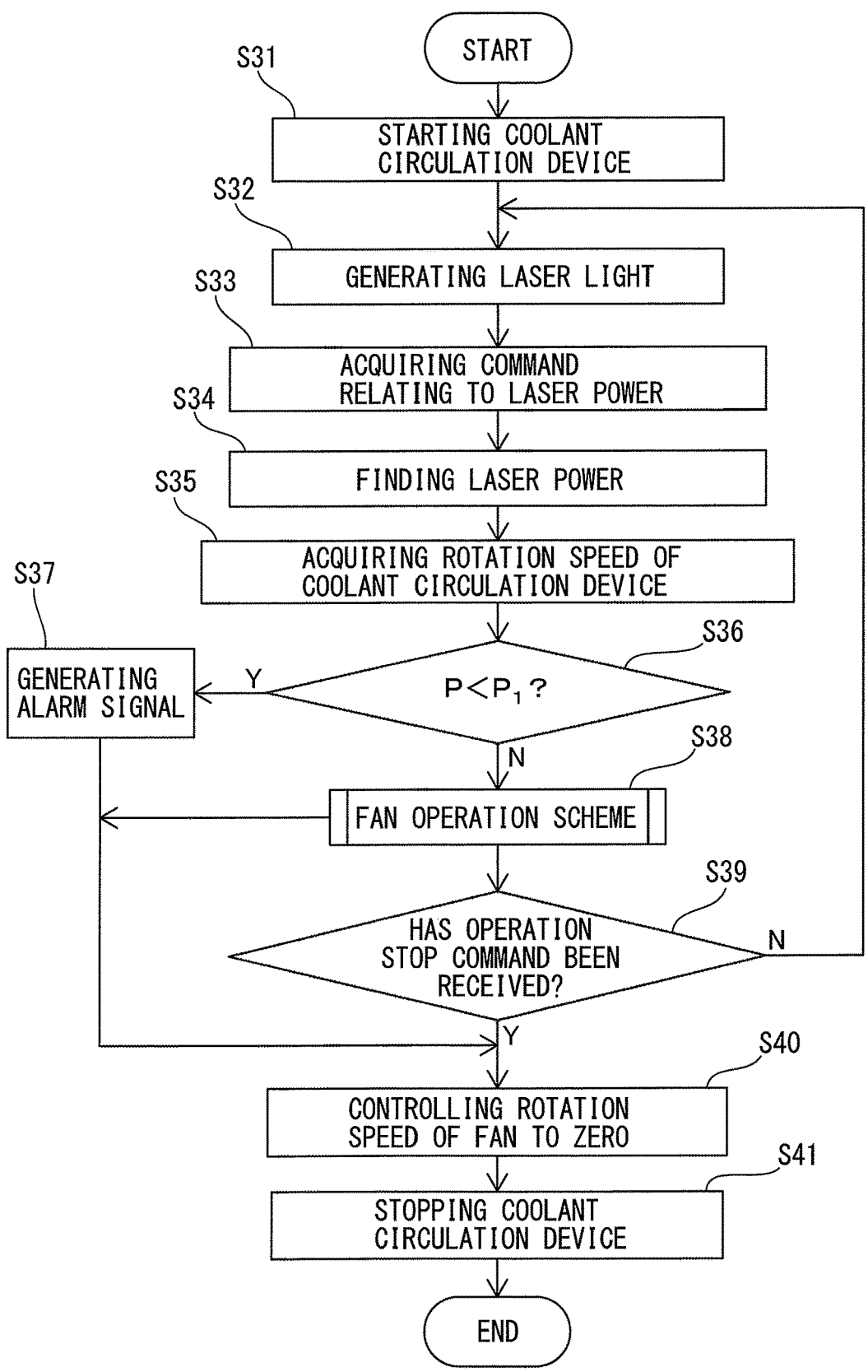
FIG. 14 is a flow chart of an example of the operation flow of the laser machining system shown in FIG. 13.

Next, the operation of the laser machining system 200 will now be described with reference to FIGS. 13 to 15. The flow shown in FIG. 14 is started when the laser oscillator controller 202 receives a laser machining command from e.g. a user, a host controller, or a laser machining program.

At step S31, the controller 156 transmits a rotation command to the motor 158 of the coolant circulation device 38 so as to rotate the coolant circulation device 38 at the rotation speed $P_0$, similarly to the above-mentioned step S1. Thereby, the fluid enclosed in the circulation path 64 (FIG. 9) of the optical fiber connection unit 180 flows through the circulation path 64 to circulate there.

At step S32, the laser oscillator controller 202 generates a laser beam. Specifically, the laser oscillator controller 202 transmits to the laser oscillator 172 a command (laser oscillating command) relating to the laser power of a laser beam to be emitted from the laser oscillator 172, in accordance with the laser machining command.

Specifically, the laser oscillator controller 202 transmits a laser output command of continuous oscillation (CW), a frequency command or duty command of pulse oscillation (PW), to the laser oscillator 172. In accordance with the command received from the laser oscillator controller 202, the laser oscillator 172 generates a laser beam and outputs it to the optical fiber connection unit 180 via the first optical fiber 16.

The optical fiber connection unit 180 relays the laser beam output by the laser oscillator 172 to the second optical fiber 18. Then, the laser beam is propagated to a laser machining head (not shown) through the second optical fiber 18, and is radiated from the laser machining head onto a workpiece W. Thus, the workpiece is machined by the laser beam in accordance with the laser machining command.

At step S33, the controller 156 acquires from the laser oscillator controller 202 the command transmitted from the laser oscillator controller 202 to the laser oscillator 172 at step S32. Specifically, the controller 156 acquires the laser output command, the frequency command, or the duty command, which has been transmitted to the laser oscillator 172 from the laser oscillator controller 202.

At step S34, the controller 156 finds laser power W of the laser beam emitted from the laser oscillator 172 based on the command acquired at step S33.

As an example, if the laser output command (e.g., 5 kW) of continuous oscillation (CW) has been transmitted at step S32, the laser power of the laser beam emitted from the laser oscillator 172 substantially coincides with the laser output command.

Therefore, in this case, the controller 156 stores in the storage the laser output command (e.g., 5 kW) acquired at step S33 as the laser power W of the laser beam emitted from the laser oscillator 172.

As another example, if the controller 156 has acquired the frequency command or the duty command at step S33, the controller 156 calculates an average of the laser power from the frequency command or the duty command. The controller 156 stores in the storage of the controller 156 the calculated average as the laser power W of the laser beam emitted from the laser oscillator 172.

At step S35, the controller 156 acquires the rotation speed P of the rotor of the coolant circulation device 38 through the encoder 160, similarly to the above-mentioned step S2.

At step S36, the controller 156 functions as a circulation device monitor 190 (FIG. 13), and determines whether $P<P_1$ is satisfied, similarly to the above-mentioned step S3. The controller 156 proceeds to step S37 when determining that $P<P_1$ is satisfied (i.e., determining "YES"). On the other hand, the controller 156 proceeds to step S38 when determining that $P \geq P_1$ is satisfied (i.e., determining "NO").

At step S37, the controller 156 generates an alarm signal in the form of an image or a sound representing "Abnormality occurs in operation of coolant circulation device", similarly to the above-mentioned step S4. Then, the controller 156 notifies a user of the alarm via a display or a speaker (not shown).

At step S38, the controller 156 carries out an operation scheme of the fan 148. Step S38 will be described with reference to FIG. 15.

After step S38 is started, at step S51, the controller 156 determines whether the laser power W found at step S34 most-recently executed is smaller than a predetermined threshold value $W_1$ of the laser power (i.e., $W<W_1$). The threshold value $W_1$ is a lower limit of the laser power W, for which it is not necessary to actuate the fan 148. The threshold value $W_1$ is predetermined by the user, and stored in the storage of the controller 156.

The controller 156 proceeds to step S52 when determining that $W<W_1$ is satisfied (i.e., determining "YES"). On the other hand, the controller 156 proceeds to step S53 when determining that $W \geq W_1$ is satisfied (i.e., determining "NO").

At step S52, the controller 156 controls the rotation speed R of the fan 148 to zero, similarly to the above-mentioned step S7.

At step S53, the controller 156 determines whether the laser power W found at step S34 most-recently executed is equal to or higher than the threshold value $W_1$ and is smaller than a predetermined threshold value $W_2$ of the laser power (i.e., $W_1 \leq W < W_2$). The threshold value $W_2$ is predetermined by the user so as to be greater than the threshold value $W_1$, and is stored in the storage of the controller 156.

The controller 156 proceeds to step S54 when determining that $W_1 \leq W < W_2$ is satisfied (i.e., determining "YES"). On the other hand, the controller 156 proceeds to step S55 when determining that $W_2 \leq W$ is satisfied (i.e., determining "NO").

At step S54, similarly to the above-mentioned step S22, the controller 156 generates the first rotation command corresponding to the first rotation speed $R_1$, and transmits it to the fan motor 150 so as to drive the fan 148 to rotate at the first rotation speed $R_1$.

At step S55, the controller 156 determines whether the laser power W found at step S34 most-recently executed is equal to or higher than the threshold value $W_2$ and is smaller than a predetermined threshold value $W_3$ of the laser power (i.e., $W_2 \leq W < W_3$). The threshold value $W_3$ is predetermined by the user so as to be greater than the threshold value $W_2$, and is stored in the storage of the controller 156.

The controller 156 proceeds to step S56 when determining that $W_2 \leq W < W_3$ is satisfied (i.e., determining "YES"). On the other hand, the controller 156 proceeds to step S57 when determining that $W_3 \leq W$ is satisfied (i.e., determining "NO").

At step S56, similarly to the above-mentioned step S24, the controller 156 generates the second rotation command corresponding to the second rotation speed $R_2$, and transmits it to the fan motor 150 so as to drive the fan 148 to rotate at the second rotation speed $R_2$.

At step S57, similarly to the above-mentioned step S25, the controller 156 generates the third rotation command corresponding to the third rotation speed $R_3$, and transmits it to the fan motor 150 so as to drive the fan 148 to rotate at the third rotation speed $R_3$.

Thus, in this embodiment, at step S34, the controller 156 finds the laser power W based on the command transmitted from the laser oscillator controller 202 to the laser oscillator 172. Then, at step S51 to S57, the controller 156 operates the fan 148 at a rotation speed depending on the laser power W.

Accordingly, the controller 156 functions as a fan controller 204 (FIG. 13) which controls the fan 148 based on the command transmitted from the laser oscillator controller 202 to the laser oscillator 172.

At step S58, the controller 156 acquires the rotation speed R of the fan 148 through the encoder 152, similarly to the above-mentioned step S26.

At step S59, the controller 156 functions as a fan monitor 194 (FIG. 13) and determines whether $R<R_1$ is satisfied, similarly to the above-mentioned step S27.

The controller 156 proceeds to step S60 when determining that $R<R_1$ is satisfied (i.e., determining "YES"). On the other hand, the controller 156 proceeds to step S39 in FIG. 14 when determining that $R \geq R_1$ is satisfied (i.e., determining "NO").

At step S60, similarly to the above-mentioned step S28, the controller 156 generates the alarm signal in the form of an image or a sound representing "An abnormality occurs in the operation of the fan". Then, the controller 156 notifies the user of the alarm via the display or the speaker, and proceeds to step S40 in FIG. 14.

Referring again to FIG. 14, at step S39, the controller 156 determines whether it has received the operation stop command, similarly to the above-mentioned step S9. The controller 156 proceeds to step S40 when determining that it has received the operation stop command (i.e., determining "YES"). On the other hand, the controller 156 returns step S32 when determining that it has not received the operation stop command (i.e., determining "NO").

At step S40, the controller 156 controls the rotation speed R of the fan 148 to zero, similarly to the above-mentioned step S52.

At step S41, similarly to the above-mentioned step S11, the controller 156 transmits the command to the motor 158 of the coolant circulation device 38 so as to stop the motor 158 of the coolant circulation device 38. Then, the controller 156 ends the flow shown in FIG. 14.

In this embodiment, the controller 156 operates the fan 148 at a rotation speed depending on the laser power W of the laser beam output from the laser oscillator 172 (steps S51 to S57). According to this configuration, the operation efficiency of the fan 148 can be optimized, and therefore it is possible to reduce the power consumption.

Note that, in the above-mentioned embodiment, the controller 156 is provided as an element separated from the oscillator controller 202. However, the controller 156 may be incorporated in the laser oscillator controller 202. In this case, the laser oscillator controller 202 functions as the controller 156.

Further, a port for replacing or pouring the coolant may be formed at the circulation paths 36, 54, 64, and 144. In this case, the port is closed by a closure member when the optical fiber connection units 30, 50, 60, 100, and 180 are in operation.

Further, an indicator for checking the amount of coolant enclosed in the circulation paths 36, 54, 64, and 144 may be provided.

Further, instead of the encoder 152, 160, an impedance detecting part which detects the impedance of the motor 150, 158 may be provided. In this respect, if the rotation of the motor 150, 158 is disturbed due to a malfunction, a fluctuation in the impedance of the motor 150, 158 occurs. Therefore, the controller 156 can detect a malfunction in the motor 150, 158 based on the impedance detected by the impedance detecting part.

For example, at the above-mentioned step S2, the controller 156 acquires an impedance Z of the motor 158 from the impedance detecting part. Then, at step S3, the controller 156 determines whether the acquired impedance Z is different from a predetermined threshold value $Z_1$ of impedance (e.g., whether the difference $|Z-Z_1|$ is equal to or greater than a threshold value).

Alternatively, at the above-mentioned step S26, the controller 156 acquires an impedance Z of the fan motor 150 from the impedance detecting part. Then, at the above-mentioned step S27, the controller 156 determines whether the acquired impedance Z is different from a predetermined threshold value $Z_2$ of the impedance (e.g., whether the difference $|Z-Z_2|$ is equal to or greater than a threshold value). By carrying out such a scheme, an abnormality in the operation of the motor 150, 158 can be detected.

Figure 9:
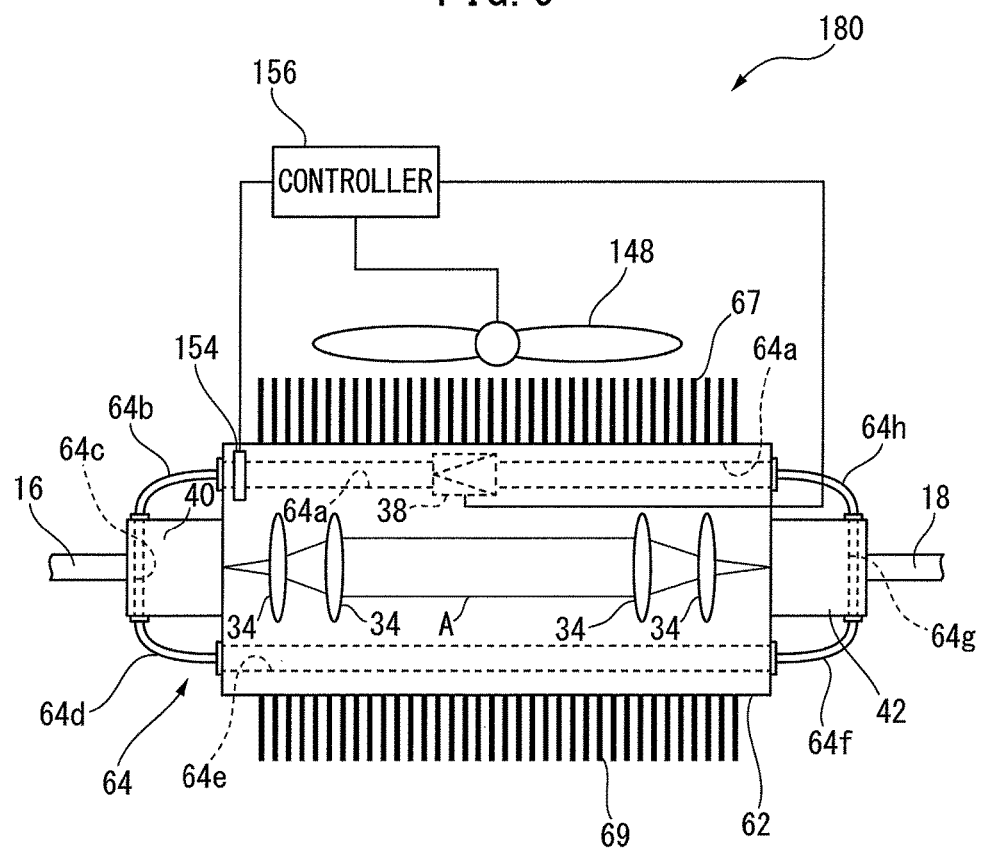
FIG. 9 is a view of the optical fiber connection unit shown in FIG. 8.

Further, in the embodiments shown in FIGS. 6 and 9, the temperature detecting part 154 may be installed at a component other than the main body 102, 62. For example, in the embodiment shown in FIG. 6, the temperature detecting part 154 may be installed at the connector part 132, 134 or 136, a component of the shutter unit 104, 106 or 108 (e.g., the coolant jacket 120, 126 or 130), or the heat radiation fin 146.

Further, in the embodiment shown in FIG. 9, the temperature detecting part 154 may be installed at the connector part 40 or 42, or the heat radiation fin 67 or 69. Further, a plurality of temperature detecting parts may be installed.

Figure 2:
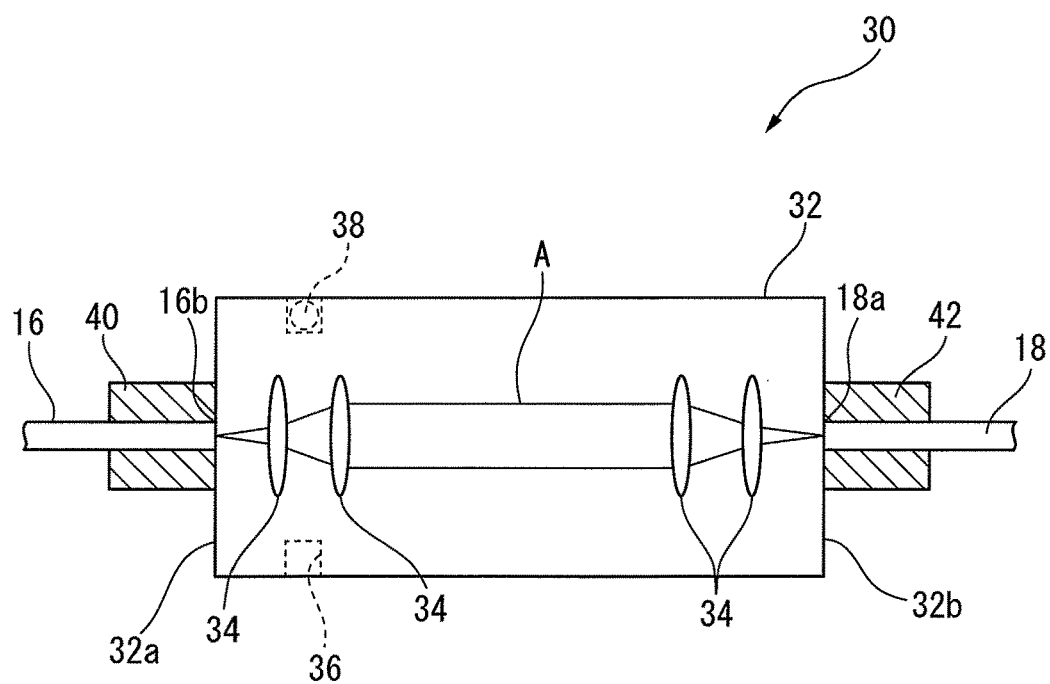
FIG. 2 is a view of the optical fiber connection unit shown in FIG. 1.
Figure 3:
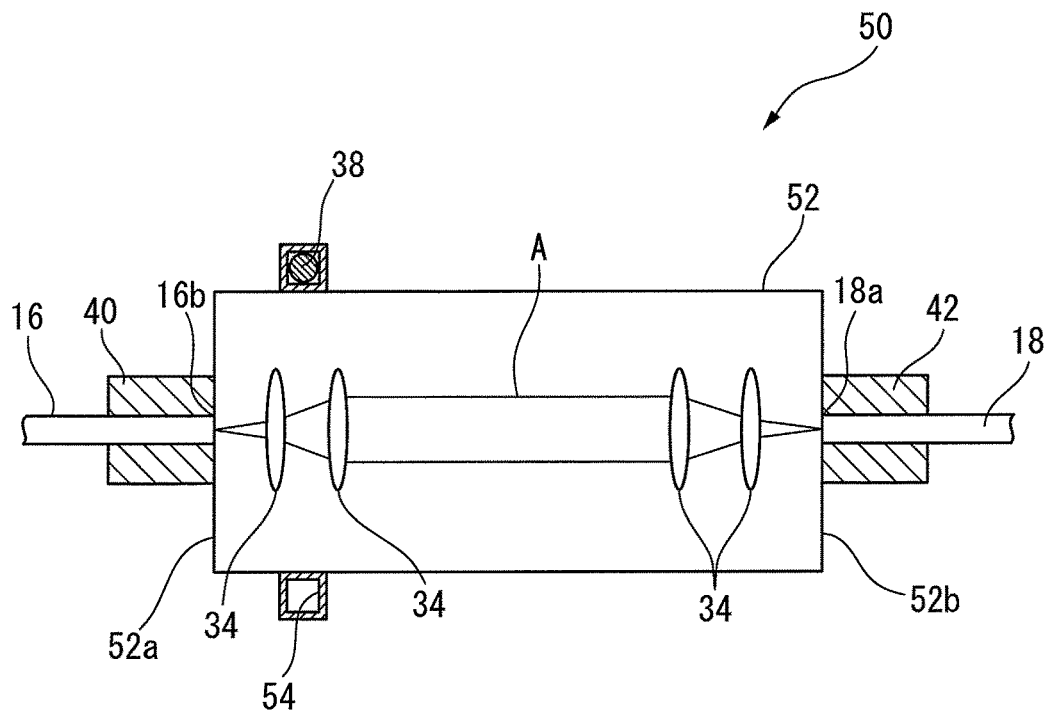
FIG. 3 is a view of an optical fiber connection unit according to another embodiment.

Further, the circulation paths 36 and 54 shown in FIGS. 2 and 3 can be applied to the embodiment shown in FIG. 6. Further, the features of the embodiments shown in FIGS. 2 to 4, 6 and 8 can be combined.

Figure 4:
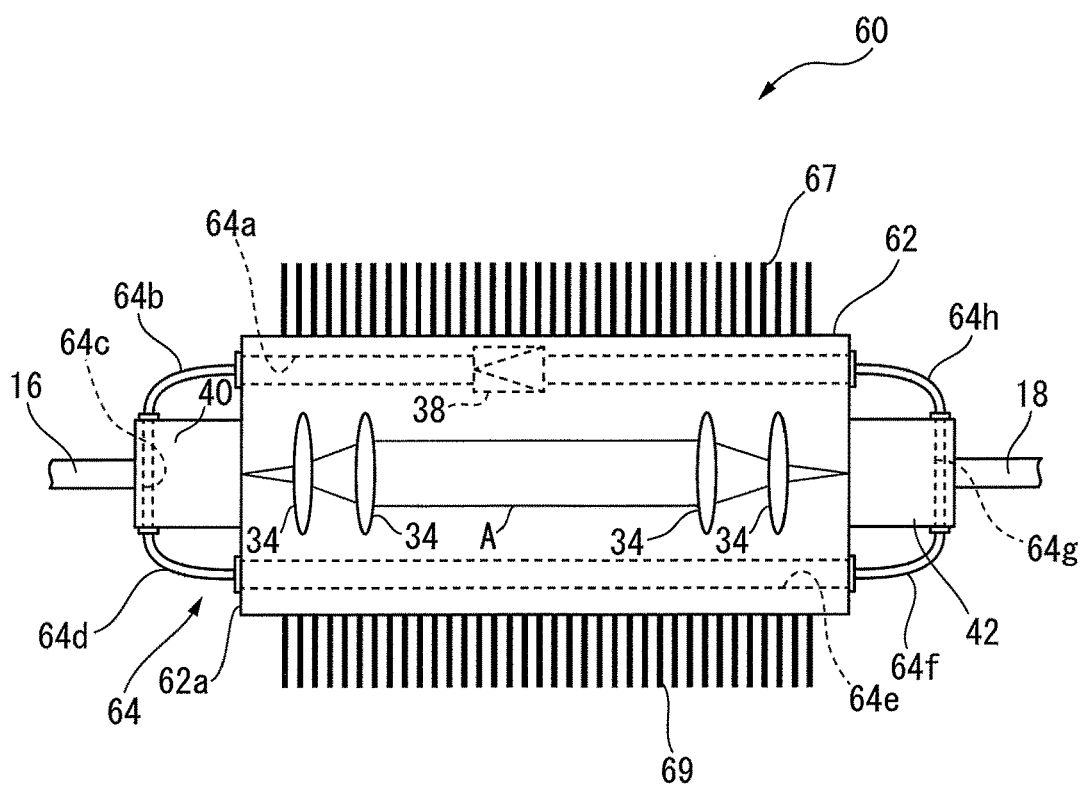
FIG. 4 is a view of an optical fiber connection unit according to still another embodiment.

For example, the circulation path 36 shown in FIG. 1 can be formed at the main body 62 of the optical fiber connection unit 60 shown in FIG. 4. In this case, the optical fiber connection unit 60 may include a first coolant circulation device which circulates the coolant in the circulation path 36, and a second coolant circulation device which circulates the coolant in the circulation path 64. Thus, the optical fiber connection unit may include a plurality of circulation paths and a plurality of coolant circulation devices.

Figure 5:
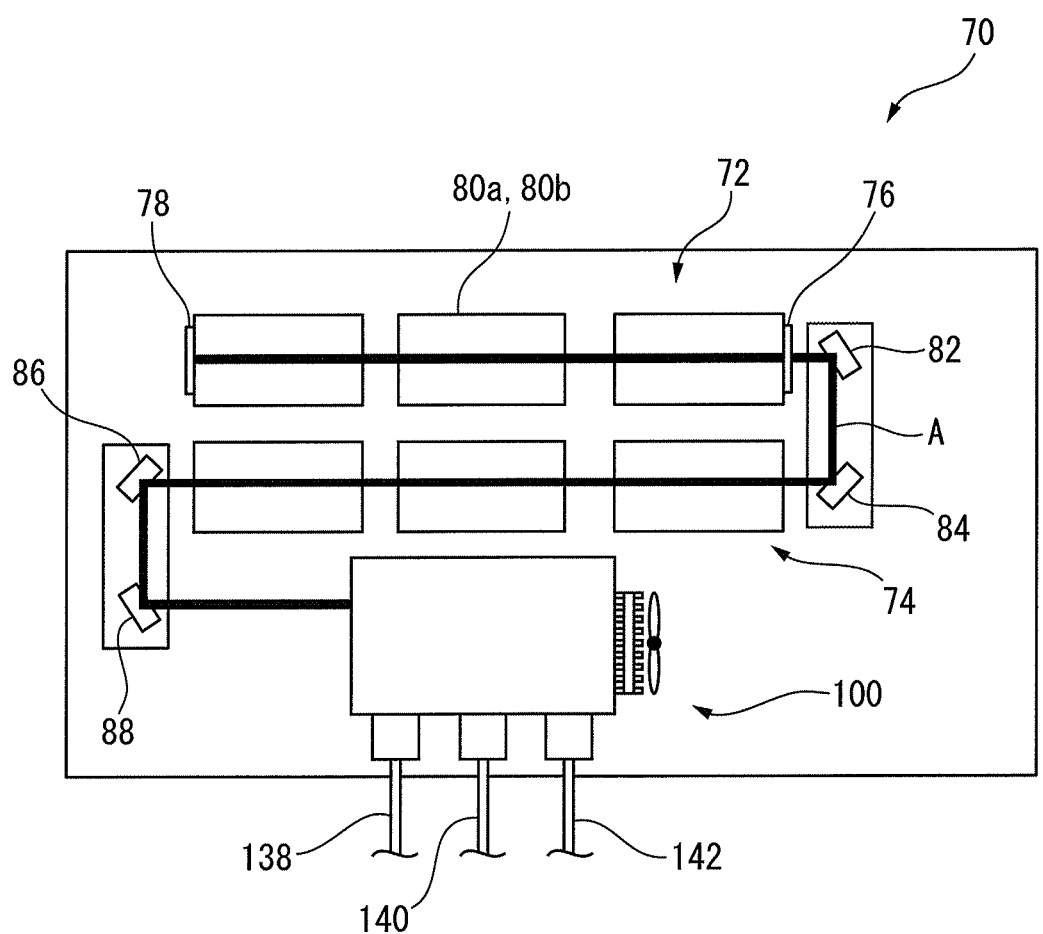
FIG. 5 is a view of a laser oscillator according to another embodiment.

Further, in the embodiment shown in FIG. 5, the controller 156 of the optical fiber connection unit 100 may be communicably connected to a laser oscillator controller which controls a laser beam generating operation of the laser oscillator 70, wherein the controller 156 and the laser oscillator controller may execute the flow shown in FIGS. 14 and 15.

In this case, at the above-mentioned step S34, the controller 156 of the optical fiber connection unit 100 finds laser power W based on a command transmitted from the laser oscillator controller to the laser oscillator 70. Then, at steps S51 to S57, the controller 156 of the optical fiber connection unit 100 operates the fan 148 at a rotation speed depending on the laser power W.

Further, a relief valve may be provided at the circulation path 36, 54, 64, 144. The relief valve is a pressure regulation valve which opens and closes in response to the pressure in the circulation path 36, 54, 64, 144.

The relief valve can prevent the circulation paths 36, 54, 64, and 144 from being damaged due to an abnormal increase of the pressure in the circulation path 36, 54, 64, 144 caused by evaporation of the coolant when the optical fiber connection unit is stopped for a long time.

Further, each of the flow paths 64a, 64e, 144b, 144d, 144f, 144i, 144k, 144m, 144o and 144q may be defined by a pipe separated from the main body or the connector part.

Further, the heat radiation fin 67, 69, 146 may be installed at any position as long as it can cool a component of the optical fiber connection unit.

Although the invention has been described above through various embodiments, the embodiments do not limit the inventions according to the claims. Further, a configuration obtained by combining the features described in the embodiments of the invention can be included in the technical scope of the invention. However, all combinations of these features are not necessarily essential for solving means of the invention. Furthermore, it is obvious for a person skilled in the art that various modifications or improvements can be applied to the embodiments.

Regarding the order of operations, such as actions, sequences, steps, processes, and stages, in the devices, systems, programs, and methods indicated in the claims, specification and drawings, it should be noted that the terms "before", "prior to", etc. are not explicitly described, and any order can be realized unless the output of a previous operation is used in the subsequent operation. Regarding the processing in the claims, specification, and drawings, even when the order of operations is described using the terms "first", "next", "subsequently", "then", etc., for convenience, maintaining this order is not necessarily essential for working the inventions.

The invention claimed is:

1. An optical fiber connection unit comprising:
a hollow main body, at one end of which a laser-beam entrance part optically connected to a first optical fiber is provided, and the other end of which a laser-beam emission part optically connected to a second optical fiber different from the first optical fiber is provided, the main body defining an inside space through which a laser beam from the laser-beam entrance part propagates;
at least one optical member positioned in the inside space between the laser-beam entrance part and the laser-beam emission part, and configured to transmit the laser beam from the laser-beam entrance part to the laser-beam emission part;
a closed circulation path which is provided at the main body, and through which a coolant for removing heat generated in the optical fiber connection unit due to the laser beam propagating through the optical fiber connection unit circulates, the circulation path being defined as a space separated from the inside space of the main body so as not to be in communication with the inside space; and
a coolant circulation device which flows the coolant so as to circulate in the circulation path.

2. An optical fiber connection unit according to claim 1, further comprising a main body which holds an optical member which condenses the laser beam,
wherein the circulation path is defined by a hole formed at the main body or a pipe attached to the main body.

3. An optical fiber connection unit according to claim 1, further comprising a heat radiation fin arranged to be adjacent to the circulation path.

4. An optical fiber connection unit according to claim 1, further comprising a fan which generates airflow which removes heat from the optical fiber connection unit.

5. The optical fiber connection unit according to claim 4, further comprising:
a temperature detecting part which detects a temperature of the optical fiber connection unit; and
a fan controller which controls the fan based on the temperature detected by the temperature detecting part.

6. An optical fiber connection unit according to claim 4, further comprising a fan controller which controls the fan based on a laser oscillation command transmitted from a laser oscillator controller to a laser oscillator.

7. The optical fiber connection unit according to claim 4, further comprising a fan monitor which monitors an operation of the fan.

8. The optical fiber connection unit according to claim 1, further comprising a circulation device monitor which monitors an operation of the coolant circulation device.

9. The optical fiber connection unit according to claim 1, wherein the closed circulation path and the coolant circulation device including a coolant pump are integral to the optical fiber connection unit.

10. An optical fiber connection unit comprising:
a hollow main body including a laser-beam entrance part, into which a laser beam enters, and a laser-beam emission part configured to emit a laser beam which enters the laser-beam entrance part to the outside, the main body defining an inside space through which a laser beam from the laser-beam entrance part propagates;
an optical member positioned in the inside space and configured to reflect the laser beam which enters the laser-beam entrance part toward the laser-beam emission part so as to change the propagation direction of the laser beam;
a closed circulation path which is provided at the main body, and through which a coolant for removing heat generated in the optical fiber connection unit due to the laser beam propagating through the optical fiber connection unit circulates, the circulation path being defined as a space separated from the inside space of the main body so as not to be in communication with the inside space; and
a coolant circulation device which flows the coolant so as to circulate in the circulation path.

* * * * *